(12) United States Patent  (10) Patent No.: US 7,923,804 B2
Zeng et al.  (45) Date of Patent: Apr. 12, 2011

(54) EDGE TERMINATION WITH IMPROVED BREAKDOWN VOLTAGE

(75) Inventors: Jun Zeng, Torrance, CA (US); Mohamed N. Darwish, Campbell, CA (US); Shih-Tzung Su, Shulin (TW)

(73) Assignee: MaxPower Semiconductor Inc., Santa Clara, CA (US)

( * ) Notice: Subject to any disclaimer, the term of this patent is extended or adjusted under 35 U.S.C. 154(b) by 313 days.

(21) Appl. No.: 12/367,716

(22) Filed: Feb. 9, 2009

(65) Prior Publication Data
US 2009/0206913 A1 Aug. 20, 2009

Related U.S. Application Data

(60) Provisional application No. 61/125,892, filed on Apr. 29, 2008, provisional application No. 61/065,759, filed on Feb. 14, 2008.

(51) Int. Cl.
*H01L 27/095* (2006.01)
*H01L 29/47* (2006.01)
*H01L 29/812* (2006.01)
*H01L 31/07* (2006.01)
*H01L 31/108* (2006.01)

(52) U.S. Cl. .......... 257/483; 257/487; 257/E29.023

(58) Field of Classification Search .......... 257/339, 257/409, 483, 487, E29.023
See application file for complete search history.

(56) References Cited

U.S. PATENT DOCUMENTS

| | | | |
|---|---|---|---|
| 5,282,018 A | 1/1994 | Hiraki et al. | |
| 5,637,898 A | 6/1997 | Baliga | |
| 5,864,159 A | 1/1999 | Takahashi | |
| 5,973,359 A | 10/1999 | Kobayashi | |
| 5,998,833 A | 12/1999 | Baliga | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,445,054 B1 * | 9/2002 | Traijkovic et al. | 257/487 |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 2001/0041407 A1 | 11/2001 | Brown | |
| 2002/0182810 A1 | 12/2002 | Oh | |
| 2003/0203576 A1 | 10/2003 | Kitada et al. | |
| 2005/0098846 A1 | 5/2005 | Nagaoka | |
| 2006/0060916 A1 | 3/2006 | Girdhar et al. | |
| 2007/0004116 A1 | 1/2007 | Hshieh | |

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.
J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.
J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

* cited by examiner

*Primary Examiner* — Hoai v Pham
(74) *Attorney, Agent, or Firm* — Robert O. Groover, III; Storm LLP

(57) ABSTRACT

A MOSFET switch which has a low surface electric field at an edge termination area, and also has increased breakdown voltage. The MOSFET switch has a new edge termination structure employing an N-P-N sandwich structure. The MOSFET switch also has a polysilicon field plate configuration operative to enhance any spreading of any depletion layer located at an edge of a main PN junction of the N-P-N sandwich structure.

20 Claims, 19 Drawing Sheets

US 7,923,804 B2

EDGE TERMINATION WITH IMPROVED BREAKDOWN VOLTAGE

CROSS-REFERENCE

Priority is claimed from U.S. application 61/125,892 filed and 61/065,759 filed Feb. 14, 2008, which are hereby incorporated by reference in their entirety.

BACKGROUND

The present application relates generally to power transistors or switches, and more particularly to the structures of edge termination areas of power metal oxide semiconductor field-effect transistors that have shallow body junctions.

DETAILED DESCRIPTION

Figure 1:
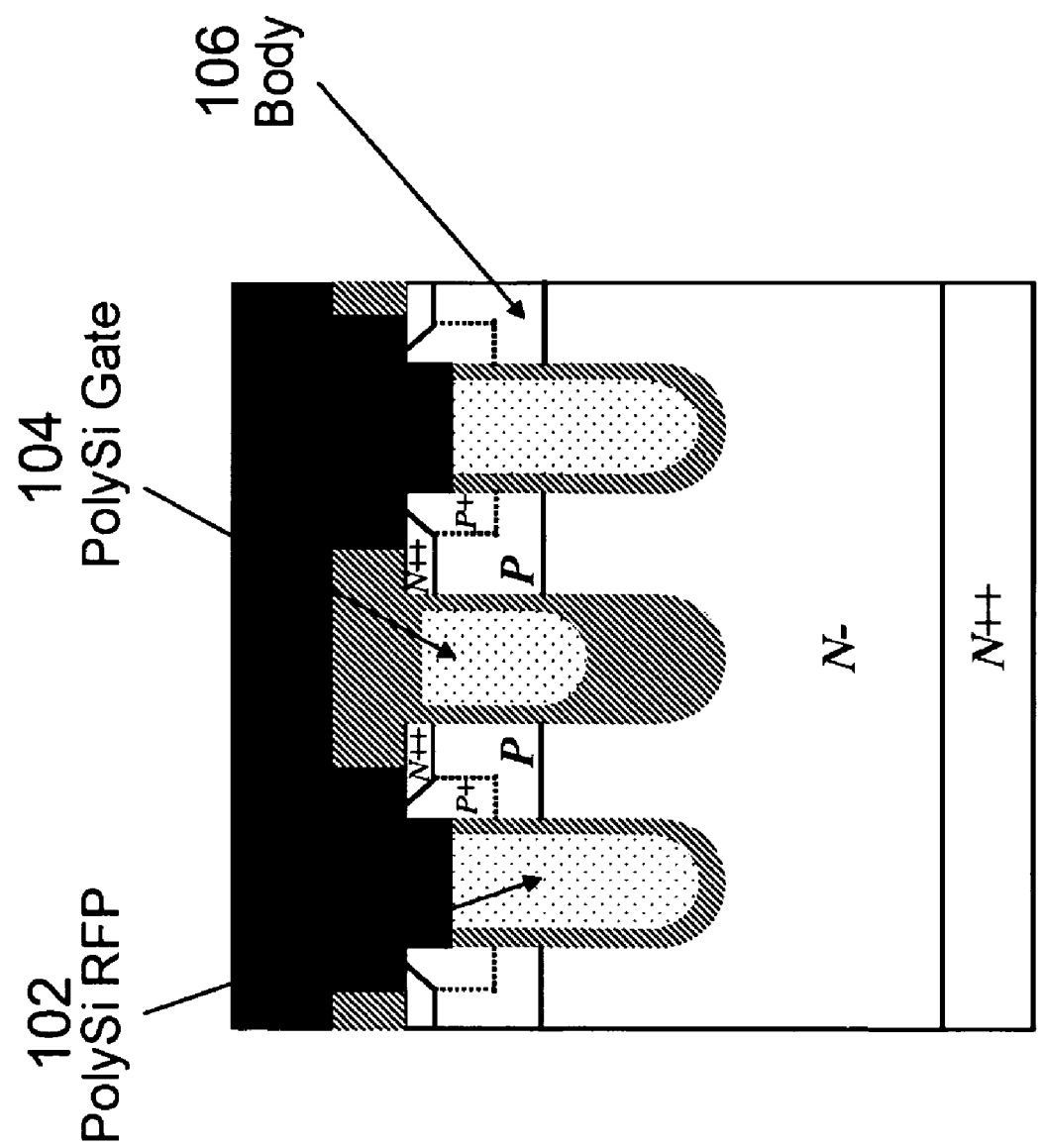
FIG. 1 is a schematic diagram of a well-known MOSFET switch having a body that has a shallow body junction depth (<0.5 um) with a short channel region (<0.25 um).

To improve the performance of power semiconductor MOSFET switches, short channels have been used to reduce both conduction and switching power losses. One example of such an advanced power MOSFET switch utilizes a Recessed Field Plate (RFP) design to limit the depletion region spreading into the body region. Such structure results in a shorter channel length without suffering punch-through breakdown and high leakage current. Various RFP-MOSFET embodiments have been described in U.S. Patent Appl. No. 2008/0073707 A1 to Darwish, the entirety of which is hereby incorporated by reference. These MOSFETs, as typically described in FIG. 1, have a doped polysilicon (PolySi) recessed field plate (RFP) 102, a doped polysilicon gate 104, and a body 106. The body 106 typically has a shallow body junction depth (currently e.g. <0.5 µm) to achieve a short channel length (currently e.g. <0.25 Mm).

Figure 2:
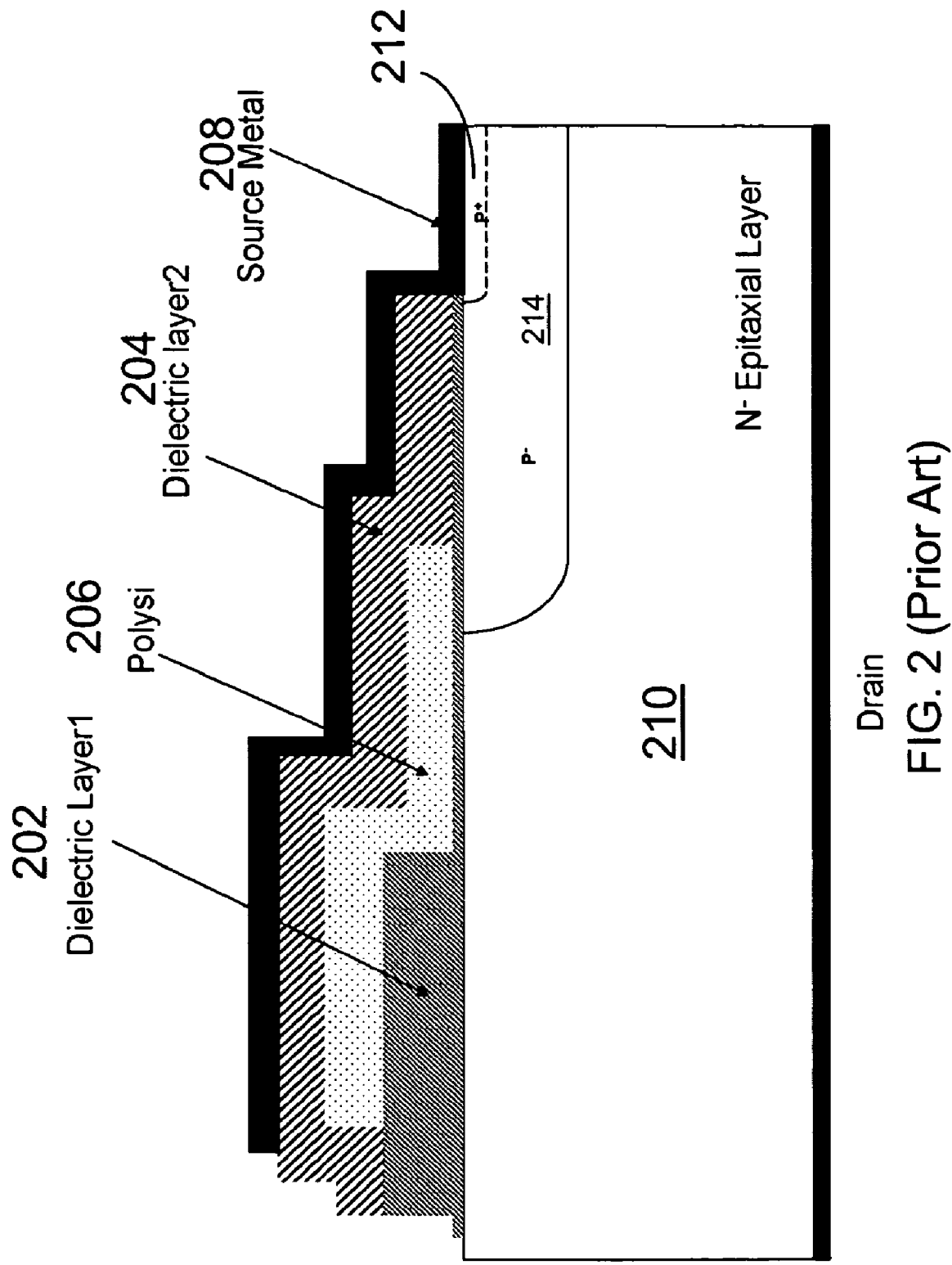
FIG. 2 is a schematic diagram of a well-known advanced power MOSFET switch having a conventional simple field plate edge termination.

However, it is well understood that the PN body junction of a MOSFET device must be terminated properly along its periphery; otherwise, the device will have a low breakdown voltage. An example of a conventional edge termination of a MOSFET device with RFP structure is shown in FIG. 2. The termination region has a first dielectric Layer 202 and a second dielectric Layer 204, as well as a polysilicon (PolySi) layer 206, a source metal 208, and an n-type epitaxial layer 210. A P+ region 212 is buried below the source metal 208, and P region 214 is buried below the first dielectric layer 202 and the second dielectric layer 204. However, this conventional termination structure has not been as effective at maximizing breakdown voltage in more advanced devices with shallow body junctions.

Figure 3:
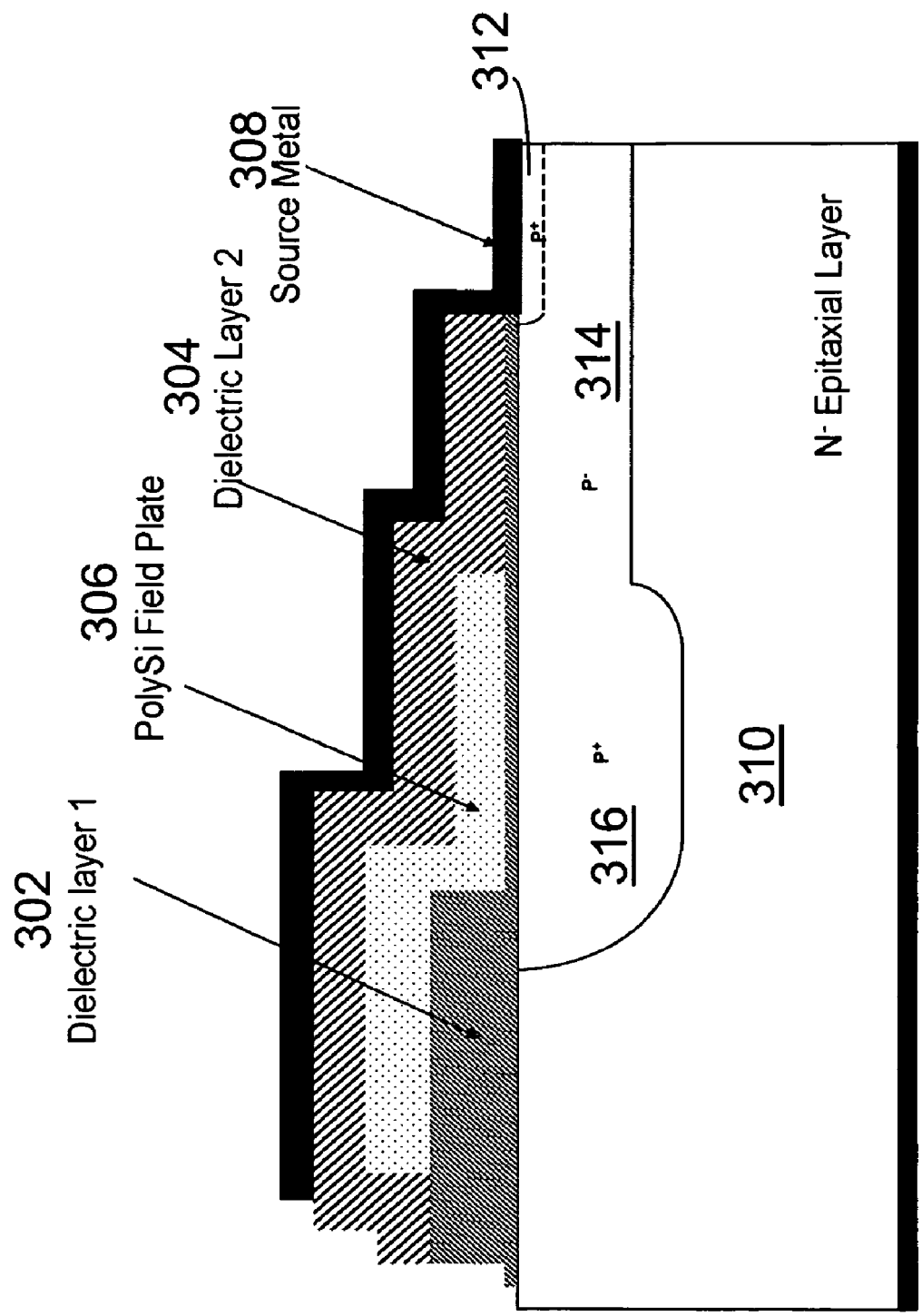
FIG. 3 is a schematic representation of a well-known MOSFET switch having a deep PN junction at an edge termination area.

One current approach introduces a deep PN junction at the edge termination area as shown in FIG. 3. In FIG. 3, the termination area has first Layer 302 and a second dielectric Layer 304, as well as a polysilicon (PolySi) field plate 306, a source metal 308, and an N- epitaxial layer 310. A first P+ region 312 is buried below the source metal 208; P region 314 is buried below the dielectric layer 2 304 separated by the dielectric layer 1 302; and a second deeper lightly doped P- region 316 is buried below the polysilicon field plate 306 which introduce a deep PN junction and increases the breakdown voltage. The P region 314 is coupled to both the P+ region 312 and the second lightly doped deep P- region 316. However, this structure needs additional masking and processing steps which increase complexity and cost of manufacturing.

Figure 11:
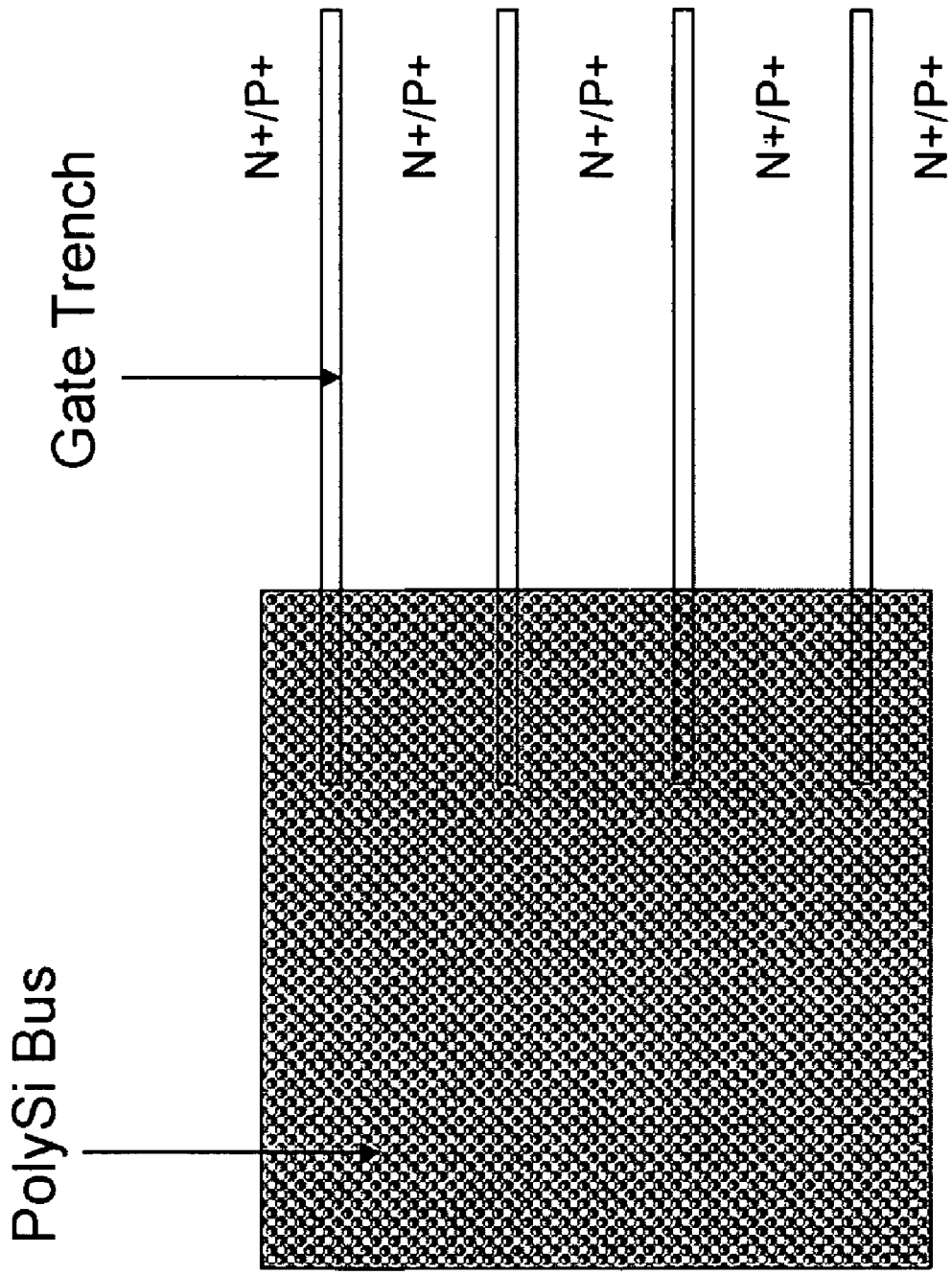
FIG. 11 is a top-view of a conventional layout of active area to gate bus or edge termination area.

Further, the current layout between the active area and the edge termination region does not efficiently prevent voltage breakdown in the edge termination area. An exemplary conventional layout of the active area to gate bus or edge termination area is shown in FIG. 11. In FIG. 11 there is no transition between the active area and the termination area. There are several drawbacks in using this layout in a shallow body junction device such as a MOSFET with a RFP structure. For example, the trench bottom (not shown in the Figure)

is less protected by the body PN junction since it is much shallower than the trench depth, and the last trenches at the device periphery may cause punch-through breakdown due to the shallow PN junction.

The present application discloses new power switching structures and methods. In particular, the application discloses various new approaches to edge termination, especially to edge termination of vertical power transistors which include shallow body junction. In one family of disclosed embodiments, shallow "sandwich" double junction structures are included in the termination area.

These sandwich structures can be combined with various field plate designs. One notable class of embodiments combines this type of multi-junction structure with surrounding trench field plates, and also includes compensating dopant underneath the surrounding trench field plate. This combines synergistically with RFP and other advanced transistor processes.

In other embodiments, a transition zone is introduced between the active area and the termination area (also called the polysilicon gate bus). The transition zone can include multiple polysilicon fingers interleaved with the Gate trench and the RFP trenches. Also in the transition zone, N+ regions are excluded, further improving the ability to resist punch-through in this area.

The disclosed innovations, in various embodiments, provide one or more of at least the following advantages. However, not all of these advantages result from every one of the innovations disclosed, and this list of advantages does not limit the various claimed inventions.

Improved punch-through voltage;
Process complexity is not increased;
Extra masking steps for the termination are not required
Extra implant steps are not required to form the termination
Tight pitch of gate trenches is achieved without yield loss due to gate contact formation;
The termination structure combines synergistically with short-channel vertical active device structures, since the termination structure makes efficient use of the shallow diffusions which are present in such structures.
Power switch devices are permitted to have short channels with increase in breakdown voltage.

The numerous innovative teachings of the present application will be described with particular reference to presently preferred embodiments (by way of example, and not of limitation). The present application describes several exemplary embodiments, and none of the statements below should be taken as limiting the claims generally.

For simplicity and clarity of illustration, the drawing figures illustrate the general manner of construction, and description and details of well-known features and techniques may be omitted to avoid unnecessarily obscuring the invention. Additionally, elements in the drawing figures are not necessarily drawn to scale, some areas or elements may be expanded to help improve understanding of embodiments of the invention.

It is contemplated and intended that the design apply to both n-type and p-type MOSFETs; for clarity, the examples given are based on n-type MOSFET structure, but one of ordinary skill would know the variations to modify the design to make a similar p-type device. The '+' sign indicates for highly doped while lack of '+' denotes for not highly doped. The figures herein are for illustrative purpose, and they typically depict the termination area on the left side of an active area of a MOSFET device.

Figure 4:
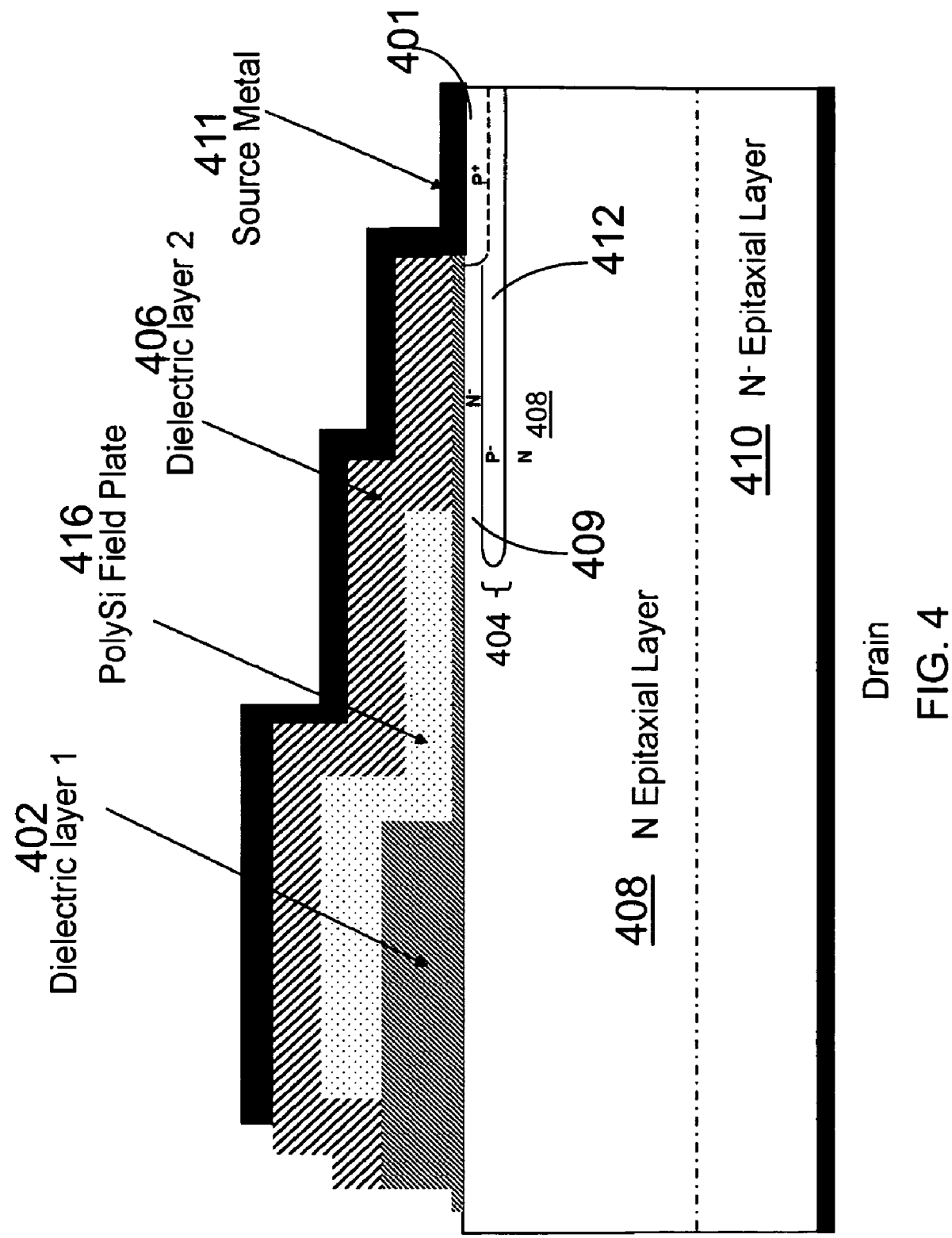
FIG. 4 is a schematic diagram of a MOSFET switch having a PN junction termination that uses an N-P-N sandwich structure combined with at least one of: a planar surface Polysilicon field plate and a metal field plate.

FIG. 4 shows a MOSFET switch having a PN junction termination that uses an N-P-N sandwich structure 404. The N-P-N sandwich structure 404, in this example, is combined with a simple stepped field plate 416. The field plate 416 overlies the edge of a first dielectric layer 402, and is covered in turn by a second dielectric layer 406. The N-P-N structure 404 includes a lightly-doped N-region 409, a lightly doped P-region 412, and a normally-doped region 408 below the lightly doped P-region 412 and the p+ region 401. This is done, for example, by using a body implant with a range and straggle such that the n-type material is not reversed to p-type at the surface. This implies, of course, that the P+ contact diffusion must be deep enough to make contact with the body diffusion.

The polysilicon field plate 416 may be connected to a source terminal (not shown) or to a gate terminal (also not shown). If desired, an additional metal field plate can be used. Dielectric layer 1 402 and dielectric layer 2 406 can be made of silicon dioxide or other similar material. They separate the source metal 411 from contacting other areas of the epitaxial layer 408, except the P+ region 401.

Figure 14:
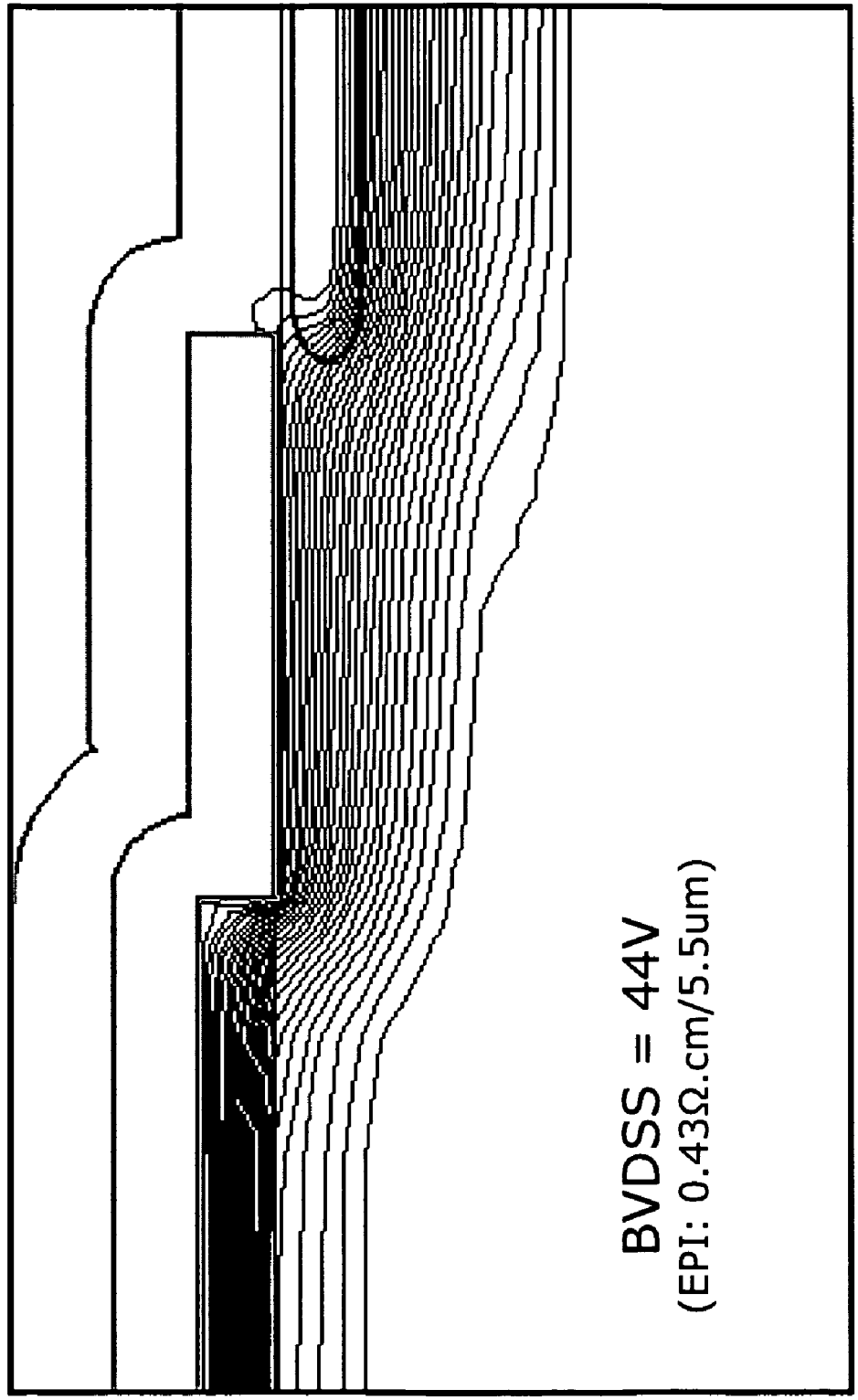
FIG. 14 is a schematic diagram of a simulation of the Potential Contours at the onset of avalanche breakdown of the termination structure of a MOSFET of FIG. 4.

A simulation result for the drain-to-source breakage voltage contour of a MOSFET device with the edge termination structure of FIG. 4 is shown in FIG. 14. In FIG. 14, the edge termination structure shows a BVdss (Drain-to-Source breakdown voltage) of 44V. This is considerably higher than those of the conventional MOSFETs with comparable RFP and termination structures. It can be seen that the p-layer in the sandwich structure 404 is partly depleted. Note how many of the isopotential lines cross this p layer at its leftmost tip, and over its lowest third, but not over the rest of the p layer. The fact that depletion is limited to the middle layer of the sandwich structure is believed to be part of the reason why it is advantageous in this context.

Figure 5:
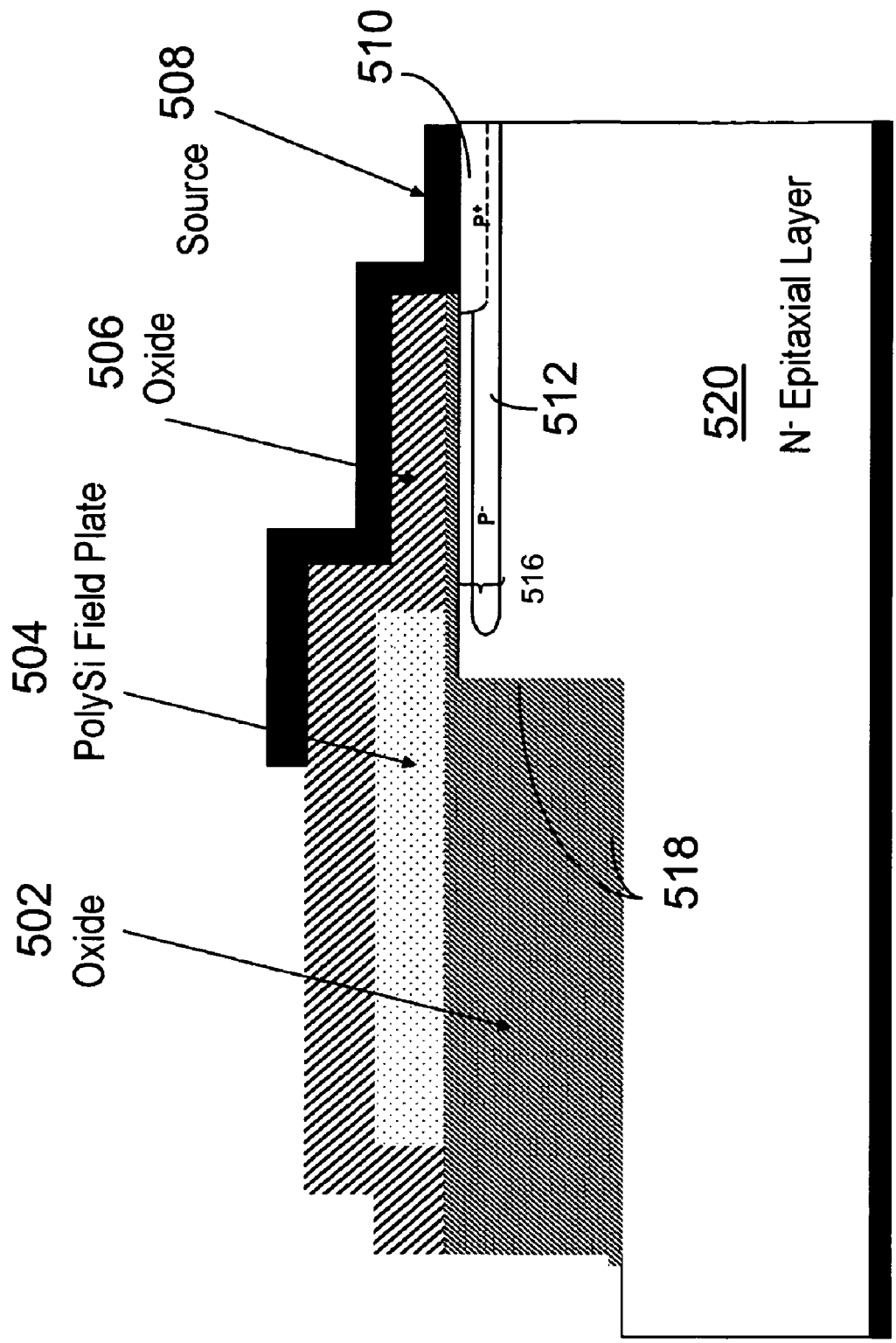
FIG. 5 is a schematic diagram of a MOSFET switch having a planar polysilicon field plate, an N-P-N sandwich termination structure, and a wide trench containing dielectric material.

FIG. 5 shows another embodiment having a wide trench 518 filled with dielectric material such as silicon dioxide 502. A planar polysilicon field plate 504 is disposed on top of oxide layer 502 while a second oxide layer 506 covers the field plate 504. A shallow N-P-N sandwich termination structure 516 is disposed between the wide trench 518 and shallow highly doped p+ region 510. Source metal 508 is in contact with the highly-doped shallow P+ region 510. The N-P-N sandwich structure 516 is formed within the N– epitaxial and is connected with the p+ region 510.

The N-P-N sandwich structure includes a buried lightly-doped P– region 512 adjacent to the P+ region 510 so that there is a shallow N-region between the top surface of the N– epitaxial layer 520 and the p+ region 510, forming an N-P-N sandwich structure.

Figure 6:
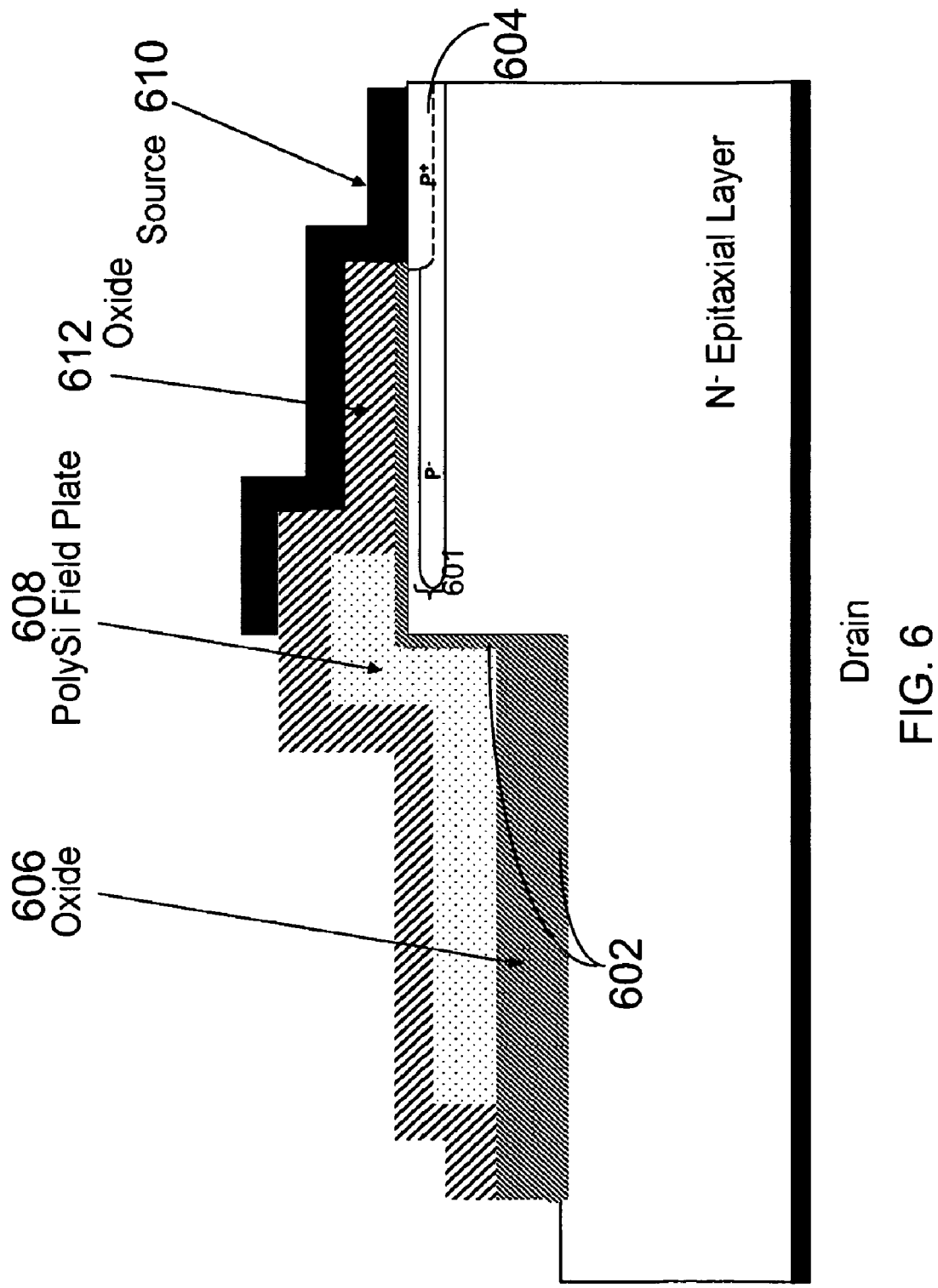
FIG. 6 is a schematic diagram of a MOSFET switch having an N-P-N sandwich termination structure, and wide trench containing a recessed polysilicon field plate.

FIG. 6 shows another embodiment of a MOSFET switch having a similar termination structure of FIG. 5 with a similar N-P-N sandwich termination structure 601 located between one of the sidewalls of the wide trench 602 and the shallow p+ region 604. However in FIG. 6 the wide trench 602 is filled with a layer of first oxide 606 and a recessed polysilicon field plate 608 or other conductive material on top of oxide 606. The shallow p+ region 604 is in contact with the source metal 610 which is separated from polysilicon field plate 608 by second layer of oxide 612.

Figure 7:
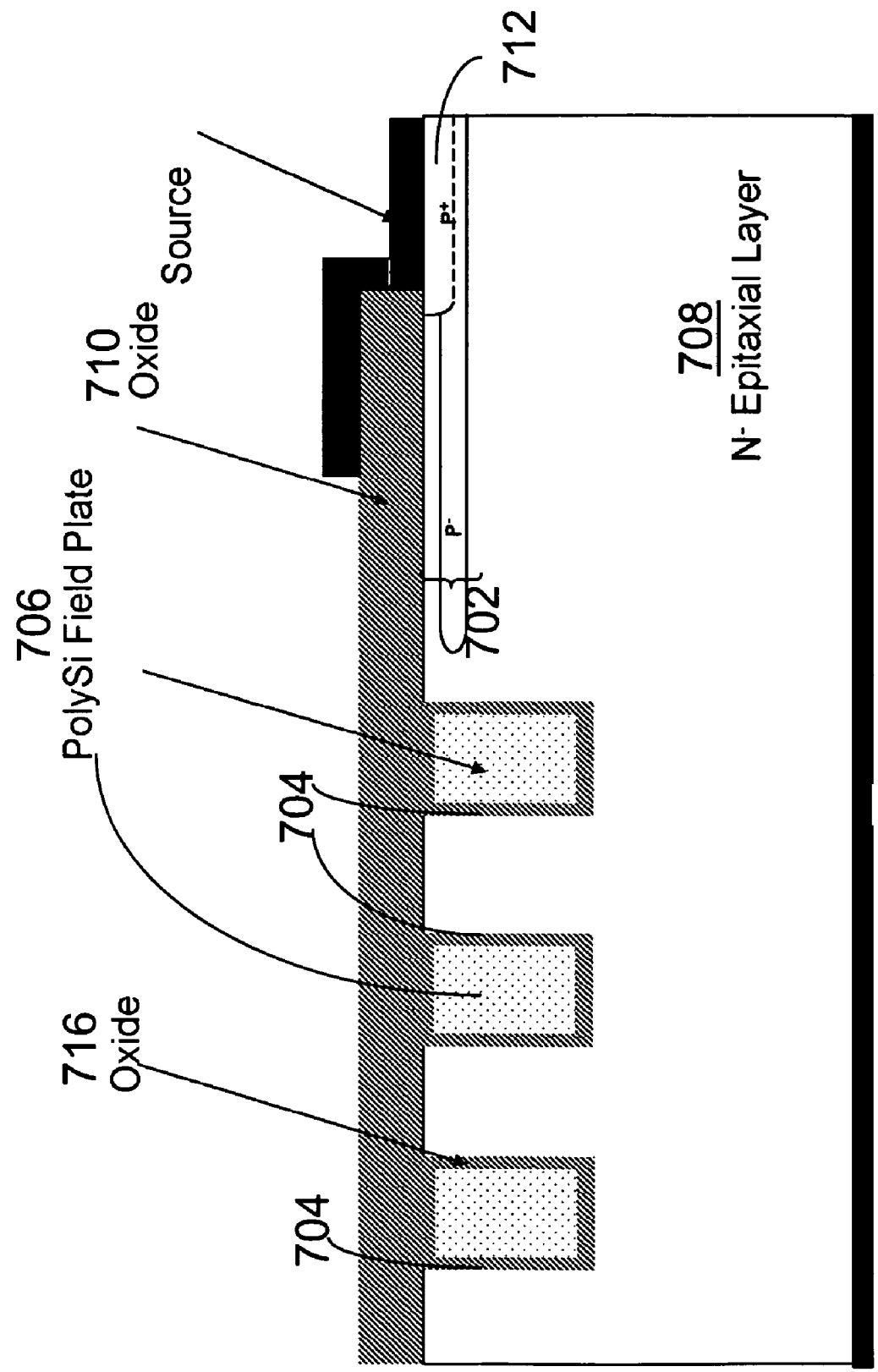
FIG. 7 is a schematic diagram of a MOSFET switch having an N-P-N sandwich termination structure with at least one fully embedded and planarized polysilicon field trench filled with conducting material.

Referencing to FIG. 7, another embodiment of a termination structure of a MOSFET having an N-P-N sandwich structure of FIG. 5 is illustrated. The shallow layers of N-P-N sandwich 702, in contact with and adjacent to the shallow highly-doped p+ region 712, is located between a fully embedded trench 704 containing planarized polysilicon and/or other conducting material 706 and the p+ region 712. Sandwich structure 702, the trench structure 706 and the p+ region 702 are horizontally in parallel. The imbedded polysilicone field plate structure 704 and 706 may be created in plurality on the top surface of the N− epitaxial layer 708 before depositing a layer of oxide 710. The walls of the trenches 704 may be insulated with dielectric material, such as oxide.

Figure 8:
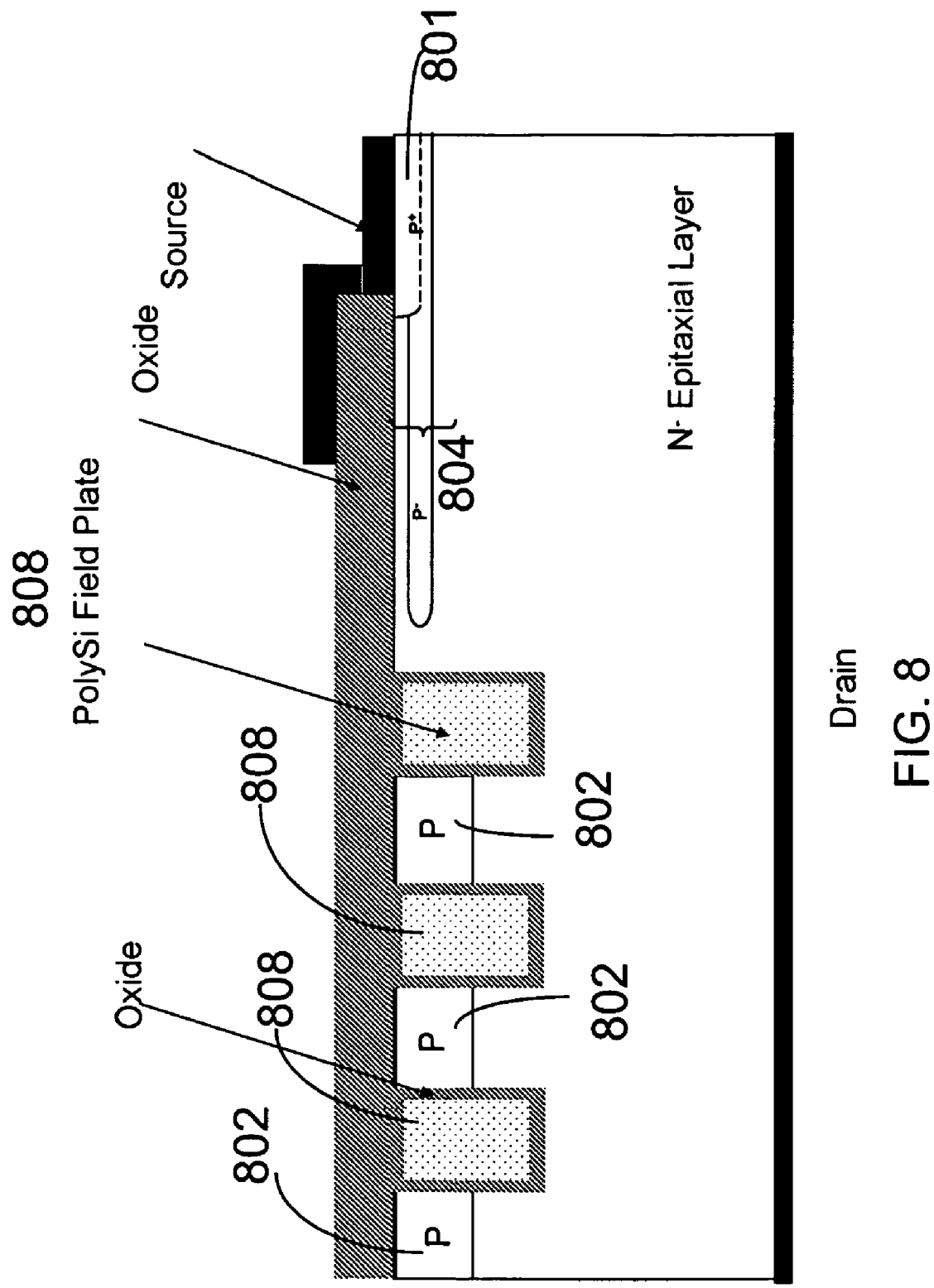
FIG. 8 is a schematic diagram of a MOSFET of FIG. 7 with at least one additional floating P region.

FIG. 8 shows a modification of the MOSFET switch of FIG. 7 with a similar shallow N-P-N sandwich structure 804 and adjacent p+ region 801. However, in FIG. 8, the termination structure further has at least one floating P region 802 between the Polysilicon Field Plate 808 containing trenches, and is in contact with one of the trench sidewalls. The floating p region 802 can be achieved via diffusion or drive in process.

Figure 9:
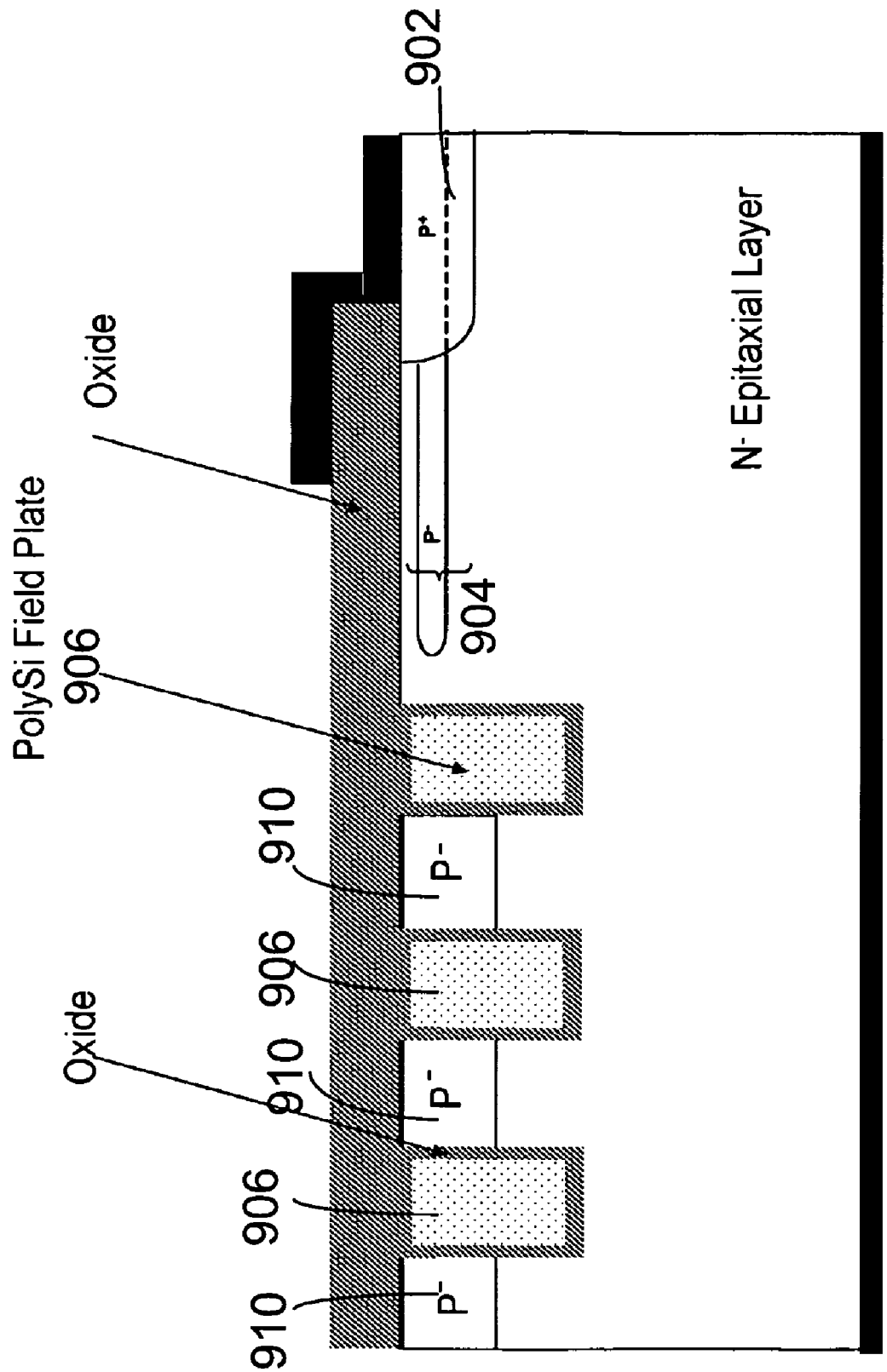
FIG. 9 is a schematic diagram of a MOSFET switch having a deep PN body junction with a PN body junction termination structure of FIG. 8.

The above described embodiments of termination structure can also be applied to MOSFET devices with a deep PN body junction. FIG. 9 shows an example of such application. The termination region of the MOSFET of FIG. 8 is modified to have a deep P+body region 902 adjacent to a similar shallow N-P-N structure 904 which is placed between a deep PN-body region 902 and a group of imbedded planarized polysilicon field plates 906 disposed in their respective trenches. The P floating regions 910 may be lightly doped with p-type dopant.

Figure 10A:
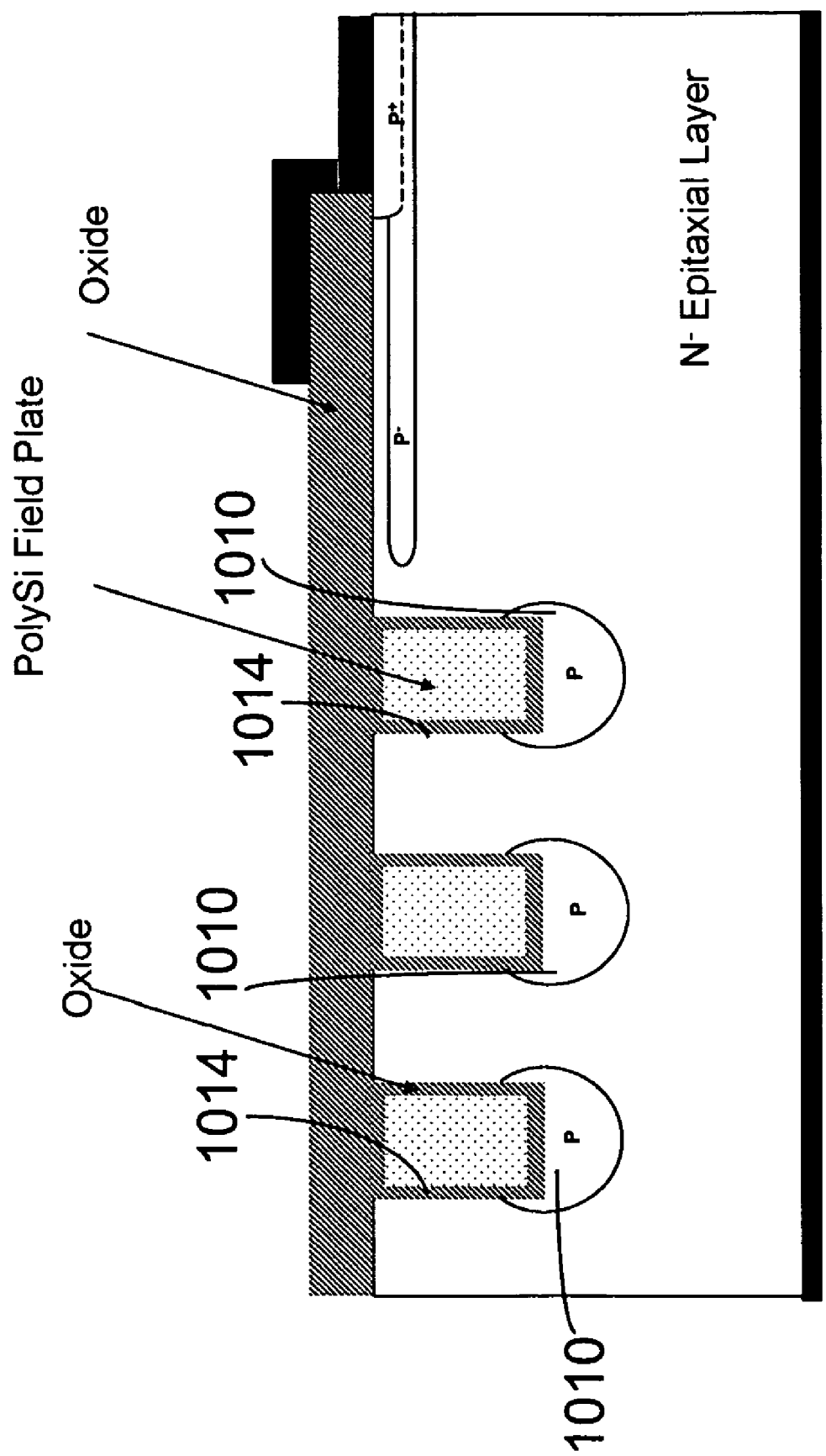
FIG. 10a shows a similar termination structure of FIG. 8 with P regions located at the bottoms of the embedded Polysilicon field plate trenches instead of having floating P regions between the trenches.
Figure 10B:
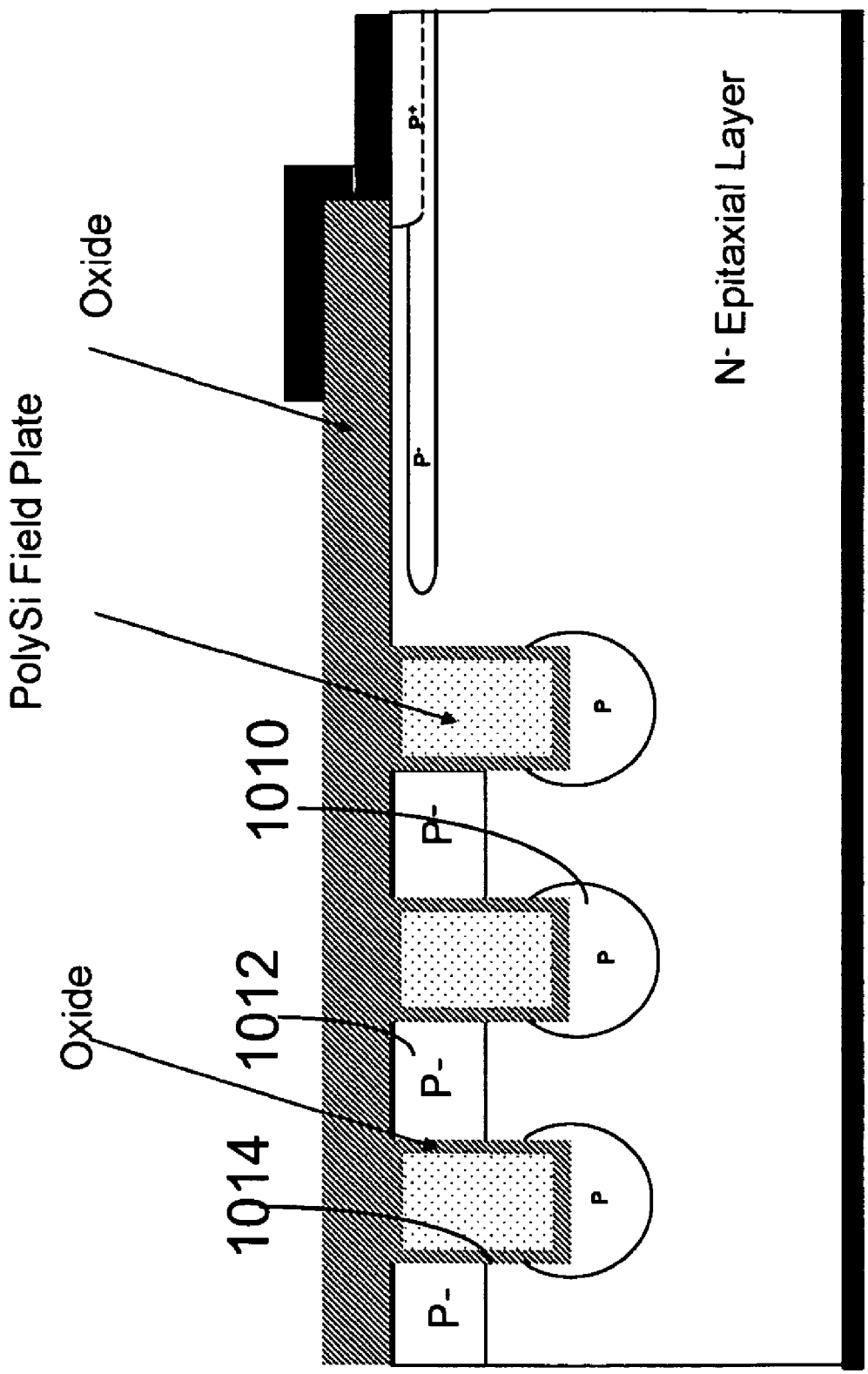
FIG. 10b shows a similar termination structure of FIG. 8 with additional P regions located at the bottoms of the embedded Polysilicon field plate trenches

As set forth in FIGS. 10a-10d, the field plate region of the termination structure can be further modified, additional P-type doped regions 1010 can be added into the bottom region of the wide trench in FIG. 4-6, and the bottom regions of the plurality of field plate trenches in FIG. 7-9. This addition smoothes the electric field distribution and protects trench bottom corners. The addition of p-type doped region 1010 can be combined with the floating p regions or p− regions 1012 between the field trenches 1014 as shown in FIG. 10b. The floating p regions 1014 can be either lightly doped or heavily doped, depending on a specific feature requirement.

Figure 10C:
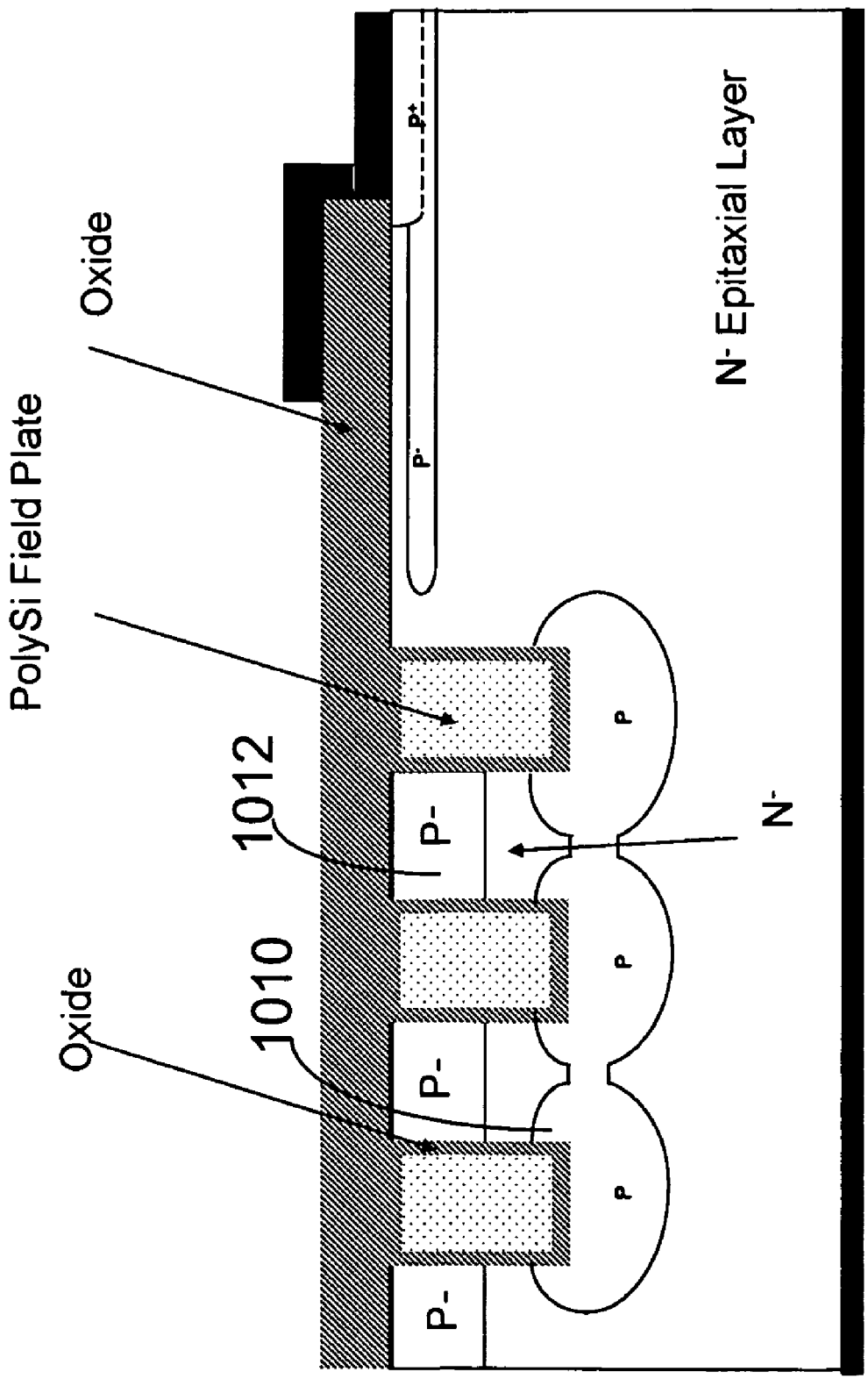
FIG. 10c shows another termination structure, in which p-type diffusions at the bottoms of the embedded Polysilicon field plate trenches are merged.
Figure 10D:
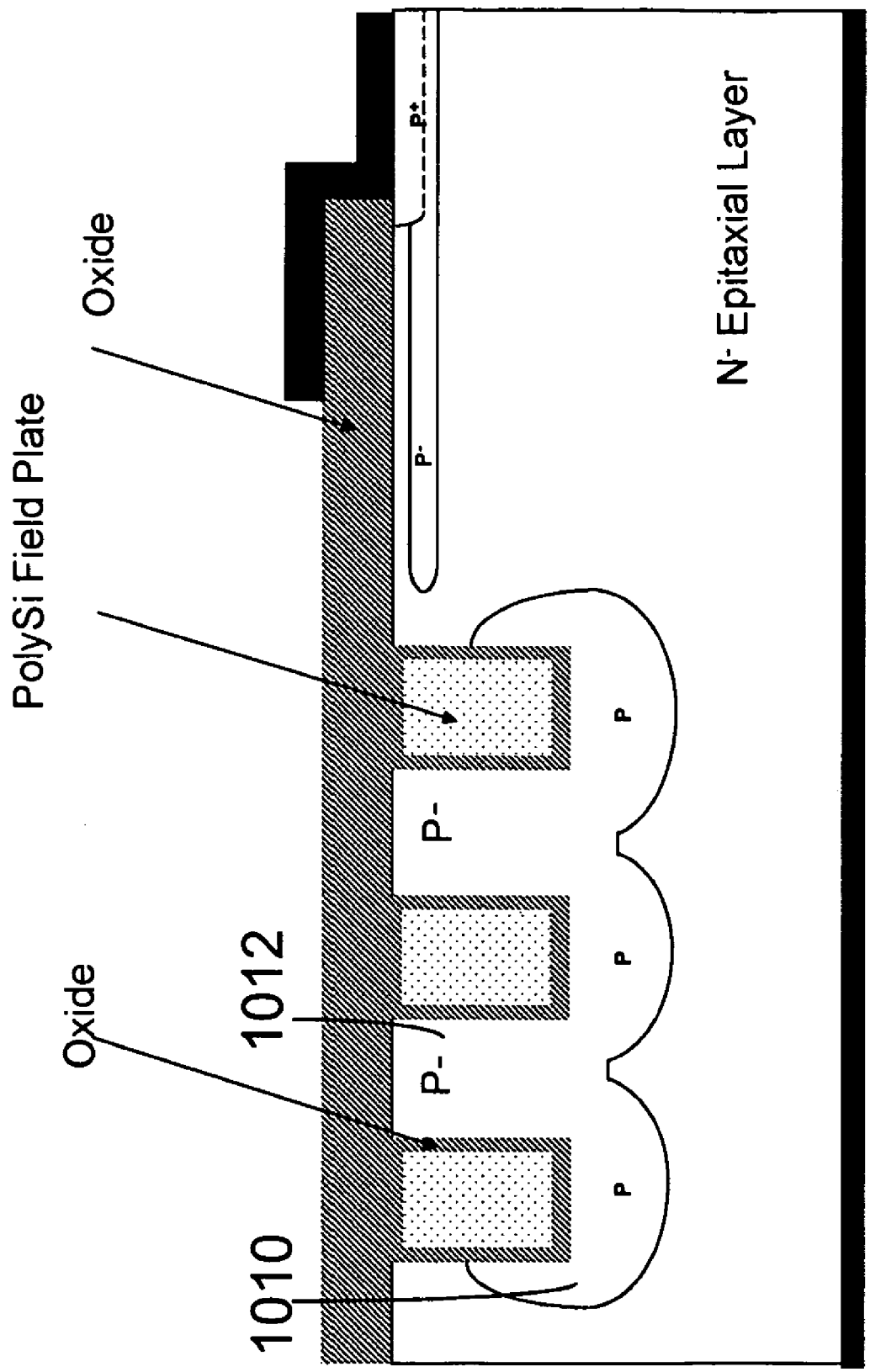
FIG. 10d shows a similar termination structure of FIG. 10c with all P regions connected with each other.

The p-type doped regions 1010 can be diffused to have different shapes by changing implant angles, diffusion conditions and dopant concentrations. The doped p-regions 1010 around the bottoms of field plate trenches can be limited to a local region, and be merged with each other as shown in FIG. 10c. The doped p-regions 1010 can also be merged with the floating p-regions 1012, forming an expanded p region around the field plate trenches 1014 as shown in FIG. 10d. These modifications further prevent punch-through break down, and increase drain-to-source breakdown voltage.

Figure 10E:
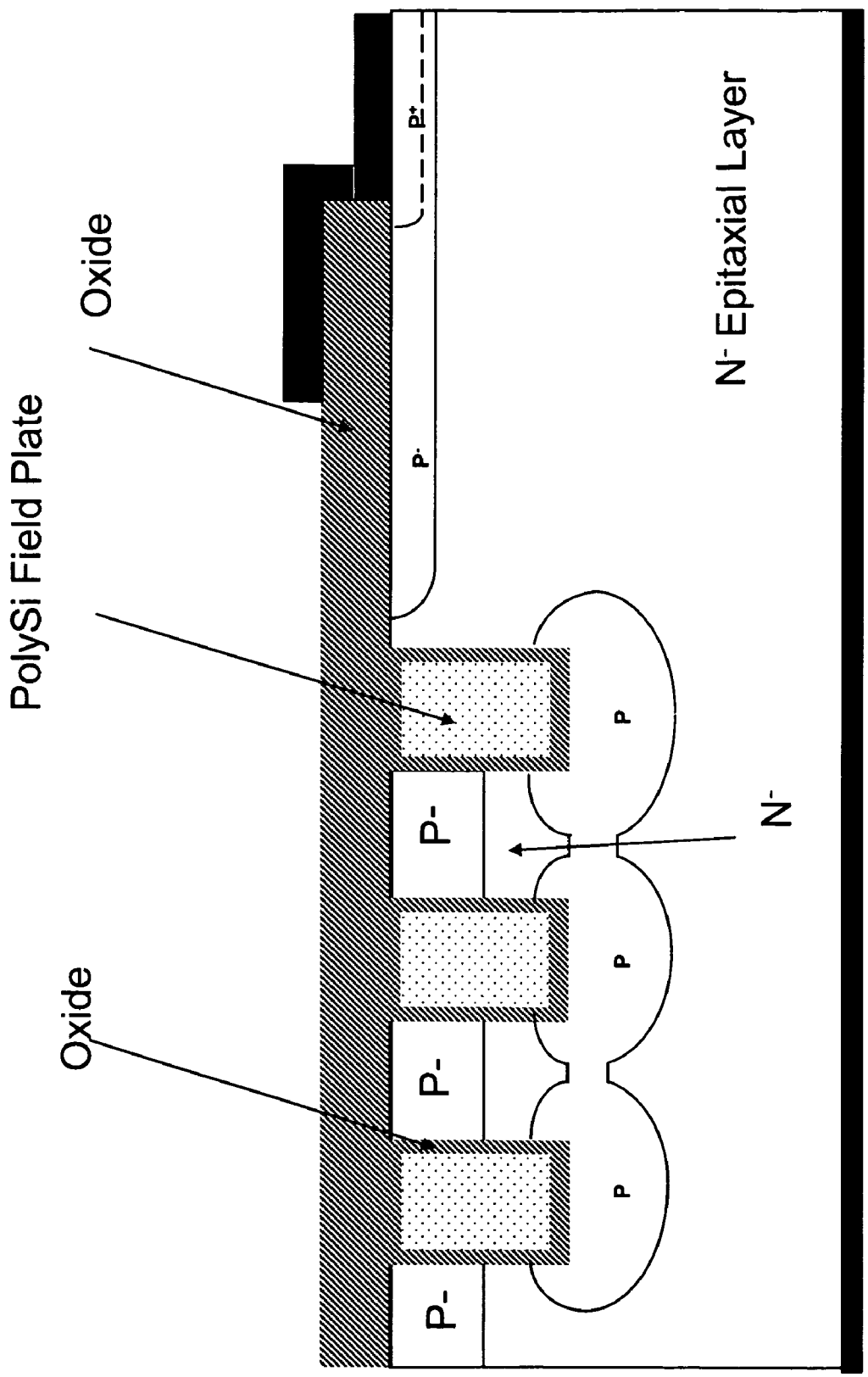
FIG. 10e shows a similar termination structure of FIG. 10d with PN junction rather than a N-P-N sandwich structure.
Figure 15:
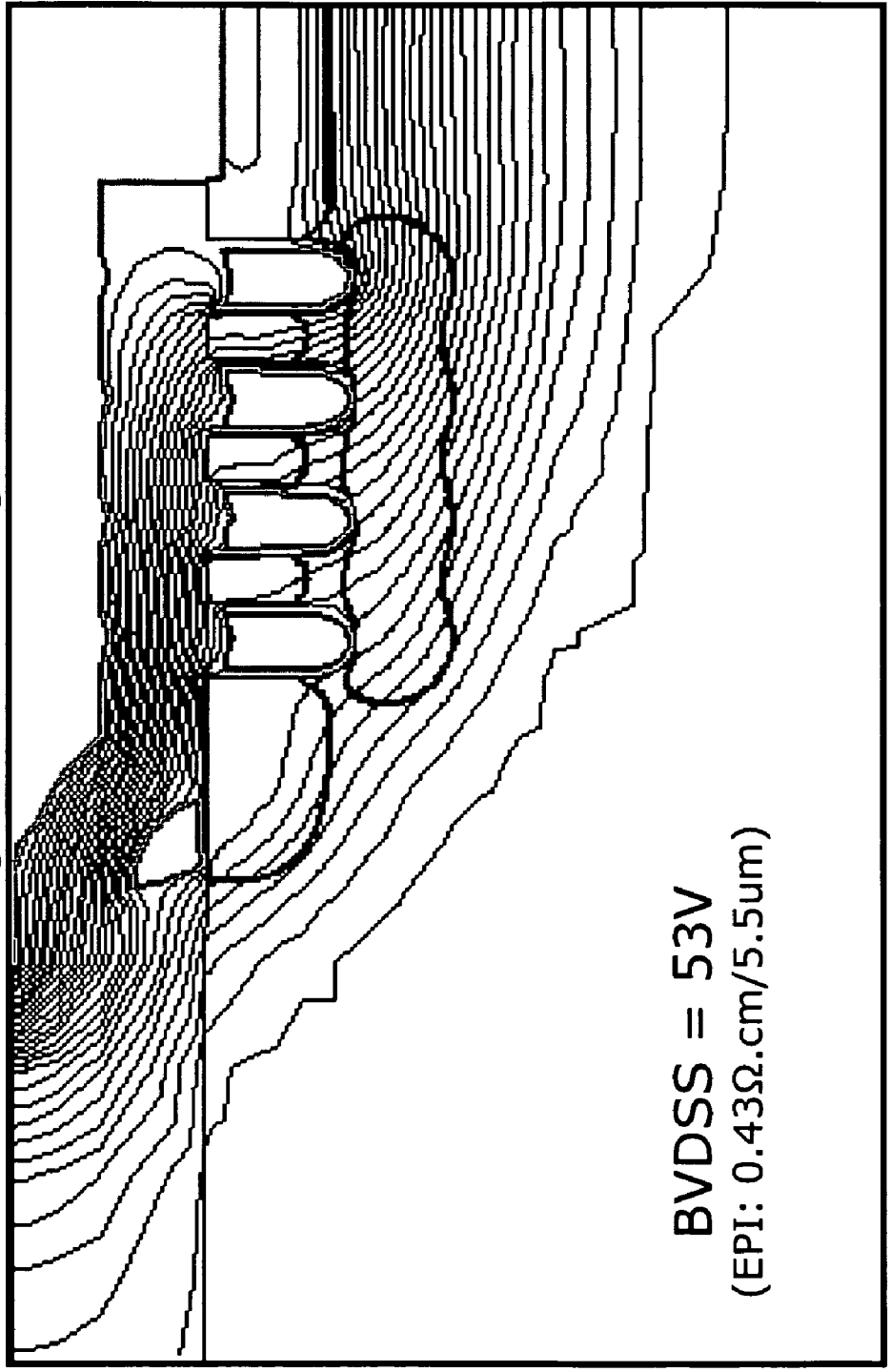
FIG. 15 is a schematic diagram of a simulation of the potential contours at the onset of avalanche breakdown of the termination structure of a MOSFET of FIG. 10c.

A simulation on the potential contours at the onset of avalanche breakdown of the edge termination structure of FIG. 10e has been conducted. As shown in FIG. 15, for the termination structure of FIG. 10e, the BVdss is increased to 53V, in comparison with the termination structure in FIG. 4 which has a BVdss of 44V (FIG. 14) and the conventional termination structure which has a BVdss of 10-30V depending on the body junction depths. The outlines of the physical structures of FIG. 10e can be seen in FIG. 15, though four concentric field plate rings are shown in this embodiment. Note that voltage contour lines run between the field plate rings, showing that they are all at different voltages. Also note that the compensated (or even counterdoped) region below the field plate rings has the effect of bending the isopotential lines downward below the outermost field plate rings. This causes the isopotential lines to be less inflected (more uniformly horizontal) below the innermost field ring. This is advantageous, because the end of the sandwich structure 404 (which can also be thought of as the end of the body diffusion) is a point where avalanche breakdown is likely. As can be seen in FIG. 15, the isopotential lines are relatively flat here, which removes geometric enhancement of electric field, and hence improves breakdown and hot carrier behavior.

Figure 12:
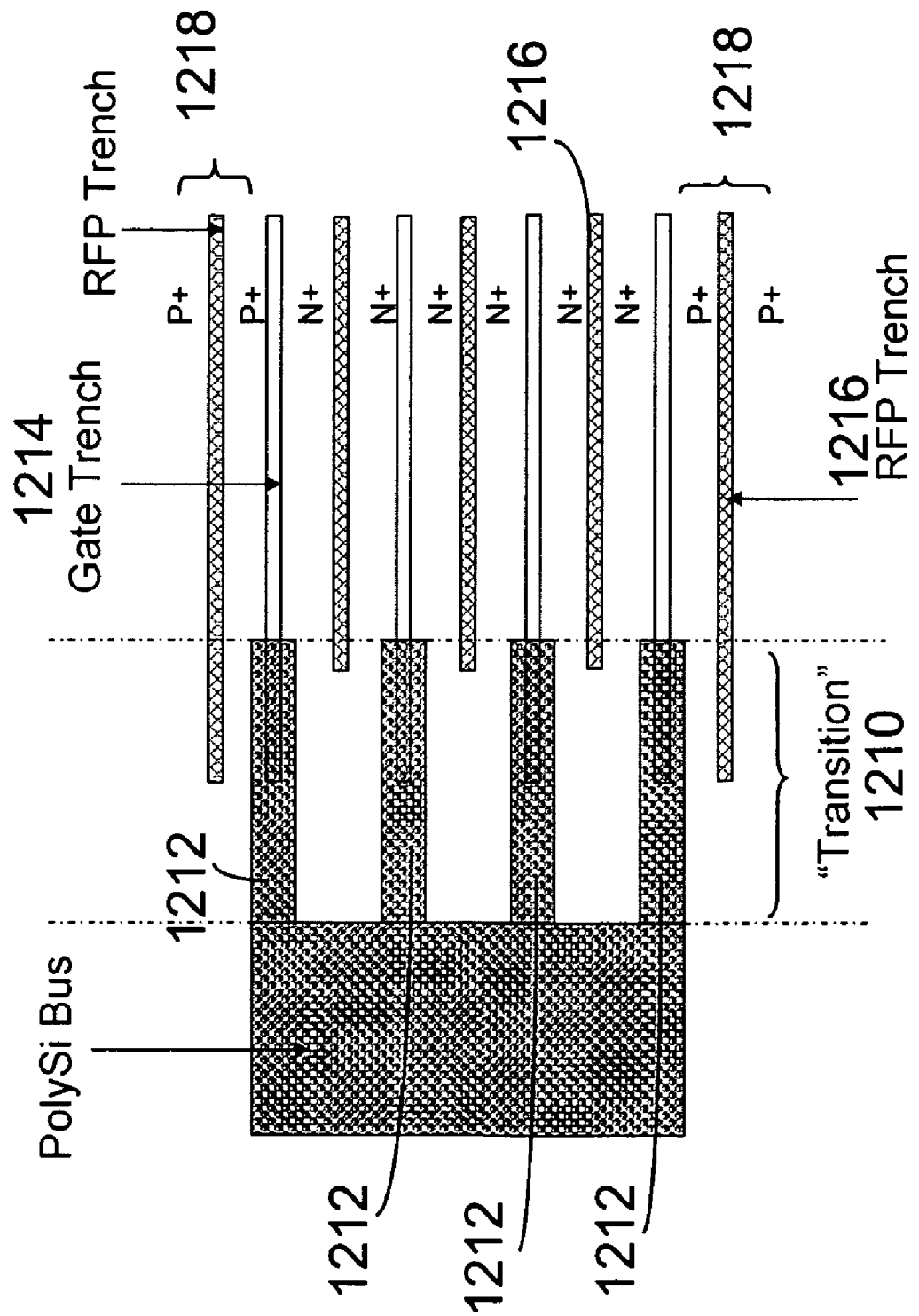
FIG. 12 is a top-view of a MOSFET switch having a transition zone in between an active area of device and a polysilicon gate bus (or edge termination area).

To improve the resistance of a MOSFET device to the breakdown voltage and punch-through break-down, a transition region 1210 is introduced between an active area of a MOSFET device and a polysilicon gate bus (or edge termination area) as shown in FIG. 12.

The transition zone 1210 includes a plurality of polysilicon fingers 1212 interleaved with a gate trench 1214 and an RFP trench 1216 so that at the end of each trench there are more PN body junction areas surrounding each polysilicon finger 1212 to provide more terminal protection. Additionally, the RFP trenches also provide more shielding effect to prevent the depletion extending into the body. Therefore, a punch-through voltage of a PN junction is increased. Furthermore, The N+ region is intentionally excluded from the periphery areas 1218 where there is no gate trench, and punch-through breakdown in the transition region can therefore generally be avoided.

Figure 13:
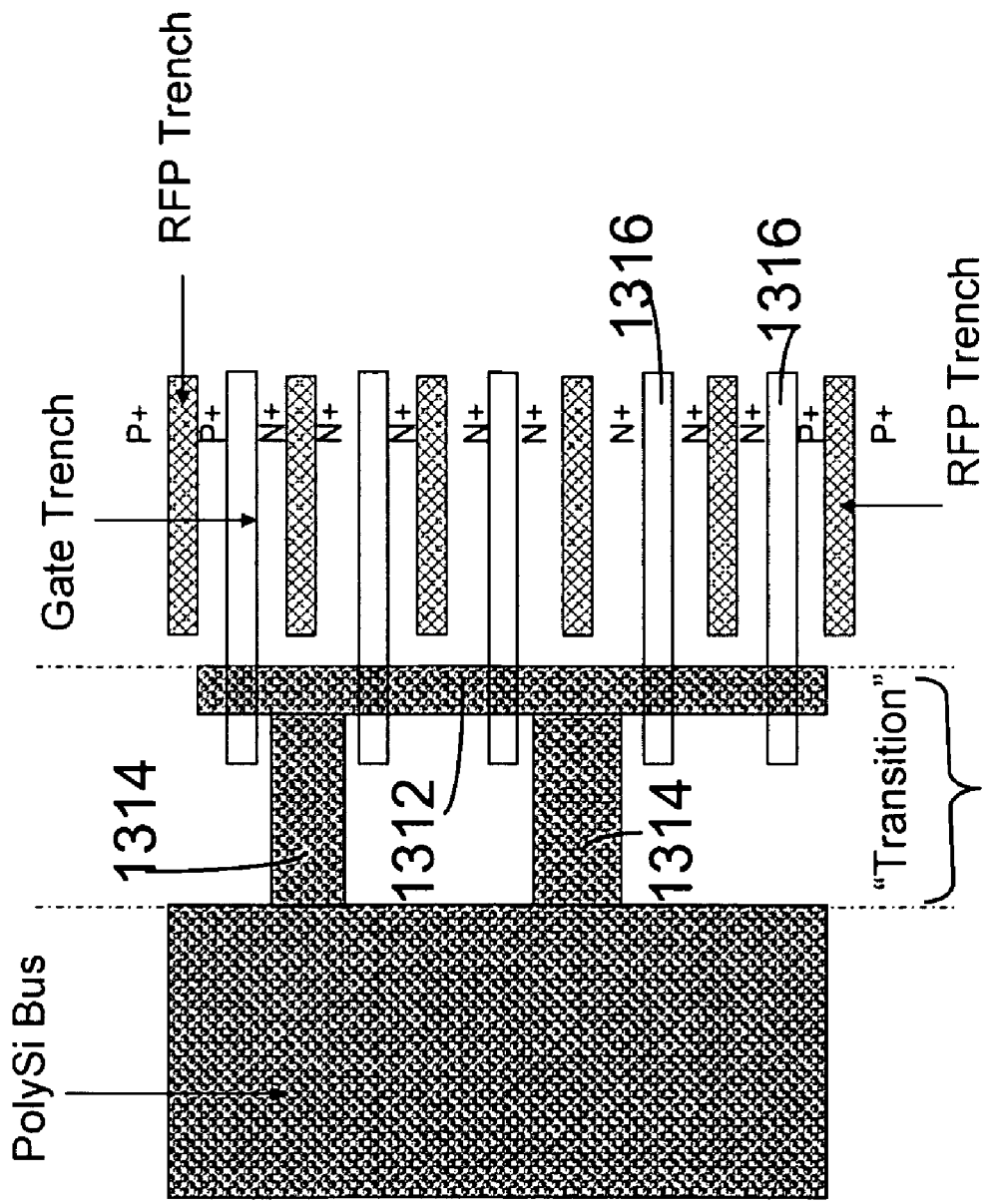
FIG. 13 is a top-view of a MOSFET switch having a transition zone in between an active area of device and a polysilicon gate bus (or edge termination area) with an extremely narrow spacing between gate trenches.

FIG. 13 shows an alternative design for introducing a transition zone between an active area of a MOSFET device and a polysilicon gate bus (or edge termination area). In FIG. 13, the transition zone 1310 has polysilicon fingers 1314 that are not in direct contact with a gate or RFP trench, but they merge with a cross-over polysilicon strip 1312 that contacts and crosses over all individual gate trenches 1316. Therefore fewer polysilicon fingers 1314 need to be formed in the transition zone. For a MOSFET having extremely narrow spacing between gate trenches the structure of FIG. 13 is preferred. The structure of FIG. 13 is also easier to realize than the structure of FIG. 12, since the polysilicon etch process and the gate spreading resistance may be more easily controlled.

The above described structures can be combined with any active area MOSFET designs that have a shallow PN-body junction to overcome the decrease in breakdown voltages and punch-through voltages. The described termination structure can also be used in MOSFET devices that have deep PN-body junctions. An example MOSFET device will have an epitaxial layer of about 5.5 μm thick, having around 0.43 ohms·cm volume resistivity. The trench depths of either gate trenches or RFP trenches are preferably around 1.0 μm. Gate trenches and RFP trenches may be substantially in equal depth. Gate trenches and RFP trenches may be insulated with a layer of dielectric material, such as silicon dioxide, generated either by deposition or by oxidation process. The gate electrode oxide thickness may preferably be around 300 Å-1000 Å, and the RFP electrode oxide thickness may be around 300 Å-1000 Å.

P-type dopant can be implanted to form the N-P-N sandwich structure, to form p-body regions, P-floating regions and various p regions at the bottom of various trenches. For example, boron at a dose of $5 \times 10^{12}$ cm$^{-2}$ and energy of 60-80 keV can be used for implantation of P− regions; boron at a dose of $5 \times 10^{12}$-$5 \times 10^{13}$ cm$^{-2}$ and energy of 60-120 keV can be used for implantation for P regions; and boron at a dose of $2 \times 10^{15}$ to $4 \times 10^{15}$ cm$^{-2}$ and energy of 20-60 keV can be used for implantation for P+ regions. Metal plugs, such as tungsten may be deposited in the upper portions of RFP trenches and the polysilicon field plate in the termination area before the source contact layer is deposited.

The various sandwich structures as described above can be formed at the same processing step as the p-body formation.

In the preferred embodiment, the energy and dose of the compensation implant into the RFP trench also works well for the isolation trenches. This process synergy provides economy as well as good performance. As the disclosed process is scaled to other operating voltages, it is expected that predictable scaling of dimensions and dopants may allow the same synergy. For example, in a 200V embodiment, the inventors contemplate that the trench depth would be slightly deeper (e.g. 1.5 to 2.5 micron), and the compensation implant energy and dose would be about the same. Of course the epi layer doping would be substantially less, and the epi layer thickness greater, as is well understood by those of ordinary skill.

According to various embodiments, there is provided: a semiconductor device, comprising one or more active device segments; an edge termination structure, surrounding one or more of said active device segments; and multiple trench field plates, successively surrounding said edge termination and each other; wherein ones of said field plates are embedded in respective trenches, and wherein respective concentrations of a compensating dopant lie beneath said trenches.

According to various embodiments, there is provided: a semiconductor device, comprising one or more active device segments having a body junction therein; an edge termination structure, surrounding one or more of said active device segments, and including a sandwich structure having back-to-back junctions, of which one is approximately coplanar with said body junction; and one or more field plates, capacitively coupled to said edge termination structure.

According to various embodiments, there is provided: a power semiconductor device, comprising an active area of one or more power devices which include a first-conductivity-type body which is reverse-biased when the device is OFF; and, adjacent said active area, a termination zone comprising a sandwich structure, which includes a first-conductivity-type diffusion, together with second-conductivity-type diffusions lying both above and below said first-conductivity-type diffusion.

According to various embodiments, there is provided: a semiconductor switch, comprising one or more active device segments having a body junction therein; an edge termination structure, surrounding one or more of said active device segments, and including a sandwich structure having back-to-back junctions, of which one is approximately coplanar with said body junction; and multiple trench field plates, successively surrounding said edge termination and each other; wherein ones of said field plates are embedded in respective trenches, and wherein respective concentrations of a compensating dopant lie beneath said trenches.

According to various embodiments, there is provided: a method of operating a power semiconductor device, comprising the actions of: a) providing a desired current characteristic using one or more active device segments; while also simultaneously b) avoiding edge breakdown by using an edge termination structure, surrounding one or more of said active device segments, and multiple trench field plates, successively surrounding said edge termination and each other; wherein ones of said field plates are embedded in respective trenches, and wherein respective concentrations of a compensating dopant lie beneath said trenches.

According to various embodiments, theres is provided: a method of operating a power semiconductor device, comprising the actions of: a) providing a desired current characteristic using one or more active device segments having a body junction therein; while also simultaneously b) avoiding edge breakdown by using both an edge termination structure which surrounds one or more of said active device segments, which includes a sandwich structure having back-to-back junctions of which one is approximately coplanar with said body junction, and also one or more field plates, capacitively coupled to said edge termination structure.

According to various embodiments, there is provided: a method of operating a power semiconductor device, comprising the actions of: a) providing a desired current characteristic using one or more active device segments having a body junction therein; while also simultaneously b) avoiding edge breakdown by using both an edge termination structure, surrounding one or more of said active device segments, and also multiple trench field plates, successively surrounding said edge termination and each other; wherein ones of said field plates are embedded in respective trenches, and wherein respective concentrations of a compensating dopant lie beneath said trenches.

According to various embodiments, there is provided: a semiconductor device edge termination structure, comprising a sandwich structure, laterally surrounding one or more of said active device segments, and including back-to-back junctions, of which one is approximately coplanar with a body junction in said active device segments; and multiple trench field plates, successively surrounding each other; wherein ones of said field plates are embedded in respective trenches, and wherein respective concentrations of a compensating dopant lie beneath said trenches.

According to various embodiments, there is provided a MOSFET switch which has a low surface electric field at an edge termination area, and also has increased breakdown voltage. The MOSFET switch has a new edge termination structure employing an N-P-N sandwich structure. The MOSFET switch also has a polysilicon field plate configuration operative to enhance any spreading of any depletion layer located at an edge of a main PN junction of the N-P-N sandwich structure.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The termination structure shown in the sample embodiments above can be modified in a variety of ways, and the scope of the claimed inventions is much broader than any of those sample embodiments, or even than all of them together. For example, other diffusions can optionally be combined with the structures shown, to further modify the distribution of potential. Similarly, other shapes can be used for the cross-sections of the field plates. Similarly, additional field plate components can be added if desired. The number and dimensions of termination elements will depend, among other things, on the operating voltage and transients to which the device will be subjected. The P-body implant can be used to form the N-P-N sandwich structure in the termination area, and independent local p-region may be implanted to form independent micro N-P-N sandwiches in the termination area.

For another class of examples, the disclosed termination structure can combine with a number of other active device structures.

For another example, although the preferred embodiment uses silicon, the disclosed inventions can also alternatively be implemented in $Si_{0.9}Ge_{0.1}$, or in various other semiconductor materials.

The regions 1010 can alternatively be doped with very light p-type dopant or very light n-type dopant, so that the formed dopant regions 1010 can be n- (ν region) or p-type (π region) or even possibly both (due to spatial variation in the dopant concentration).

For another example, the disclosed innovations can also be applied to diodes.

The device may be fabricated in various layouts, including "stripe" and "cellular" layouts. The layers of source, body, drain regions can be configured vertically, quasi-vertically as well as laterally. The epitaxial drift region can be either uniformly or non-uniformly doped. While the embodiments described above include an epitaxial layer grown on a substrate, the epitaxial layer may be omitted in some applications. Various features of different embodiments may be combined and recombined for various applications.

The design can also be applied to IGBTs or other devices which include bipolar conduction. The bottom of the gate trench can be modified with dopant; the design can also vary at the source structure and at the drain structure; and alternative body structure may be used; contact trench may be produced first, then cut gate trench, and construct the source and drain structure.

The following applications may contain additional information and alternative modifications: Ser. No. 61/058,069 filed Jun. 2, 2008 and entitled "Edge Termination for Devices Containing Permanent Charge"; Ser. No. 61/060,488 filed Jun. 11, 2008 and entitled "MOSFET Switch"; Ser. No. 61/074,162 filed Jun. 20, 2008 and entitled "MOSFET Switch"; Ser. No. 61/076,767 filed Jun. 30, 2008 and entitled "Trench-Gate Power Device"; Ser. No. 61/080,702 filed Jul. 15, 2008 and entitled "A MOSFET Switch"; Ser. No. 61/084,639 filed Jul. 30, 2008 and entitled "Lateral Devices Containing Permanent Charge"; Ser. No. 61/084,642 filed Jul. 30, 2008 and entitled "Silicon on Insulator Devices Containing Permanent Charge"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/028,790 filed Feb. 14, 2008 and entitled "Trench MOSFET Structure and Fabrication Technique that Uses Implantation Through the Trench Sidewall to Form the Active Body Region and the Source Region"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/118,664 filed Dec. 1, 2008 and entitled "An Improved Power MOSFET and Its Edge Termination"; and Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device, comprising:
   one or more active device segments;
   an edge termination structure, surrounding one or more of said active device segments; and
   multiple trench field plates, successively surrounding said edge termination and each other;
   wherein ones of said field plates are embedded in respective trenches, and wherein respective concentrations of a compensating dopant lie beneath said trenches.

2. The device of claim 1, wherein an additional field plate, which is not embedded in a trench, also surrounds one or more of said trench field plates.

3. The device of claim 1, wherein said active device segments include vertical field-effect transistors.

4. The device of claim 1, wherein said active device segments also include recessed field plates intermingled with active devices, and said recessed field plates also have compensating dopant concentrations thereunder.

5. The device of claim 1, wherein said active device segments also include recessed field plates intermingled with active devices, and said recessed field plates also have compensating dopant concentrations thereunder; and wherein said recessed field plates in said active device segments have the same characteristics as one or more of said trench field plates.

6. The device of claim 1, wherein multiple ones of said trench field plates are electrically floating.

7. The device of claim 1, wherein said respective concentrations of a compensating dopant, under multiple ones of said trench field plates, are heavy enough to invert the conductivity type of material thereunder.

8. The device of claim 1, wherein said respective concentrations of a compensating dopant, under multiple ones of said trench field plates, are outdiffused far enough to mutually overlap.

9. The device of claim 1, further comprising at least one non-trench field plate inboard of said trench field plates.

10. The device of claim 1, wherein said active device segments include a body junction which extends into some, but not all, of said termination.

11. The device of claim 1, wherein said active device segments and said termination are constructed in epitaxial semiconductor material.

12. The device of claim 1, further comprising a transition zone, between the active device segments and said edge termination structure.

13. A semiconductor device, comprising:
   one or more active device segments having a body junction therein;
   an edge termination structure, surrounding one or more of said active device segments, and including a sandwich structure having back-to-back junctions, of which one is approximately coplanar with said body junction; and
   one or more field plates, capacitively coupled to said edge termination structure.

14. The device of claim 13, wherein said sandwich structure includes a p-type middle layer between n-type layers.

15. The device of claim 13, wherein said body junction is less than 0.5 micron deep.

16. The device of claim 13, comprising a plurality of said field plates.

17. A method of operating a power semiconductor device, comprising the actions of:
   a) providing a desired current characteristic using one or more active device segments; while also simultaneously
   b) avoiding edge breakdown by using an edge termination structure, surrounding one or more of said active device segments, and multiple trench field plates, successively surrounding said edge termination and each other;
   wherein ones of said field plates are embedded in respective trenches, and wherein respective concentrations of a compensating dopant lie beneath said trenches.

18. The method of claim 17, wherein an additional field plate, which is not embedded in a trench, also surrounds one or more of said trench field plates.

19. The method of claim 17, wherein said active device segments include vertical field-effect transistors.

20. The method of claim 17, wherein said active device segments also include recessed field plates intermingled with active devices, and said recessed field plates also have compensating dopant concentrations thereunder.

* * * * *